US011307609B2

(12) United States Patent
Chen et al.

(10) Patent No.: US 11,307,609 B2
(45) Date of Patent: Apr. 19, 2022

(54) METHODS FOR DATA SYNCHRONIZATION BETWEEN A SENSOR HUB AND AN APPLICATION PROCESSOR AND APPARATUSES USING THE SAME

(71) Applicant: VIA Alliance Semiconductor Co., Ltd., Shanghai (CN)

(72) Inventors: Jiangze Chen, Shanghai (CN); Dongxing Wu, Shanghai (CN); Deming Gu, Shanghai (CN); Guixiang He, Shanghai (CN); Kangning Zhu, Shanghai (CN)

(73) Assignee: GlenFly Technology Co., Ltd., Shanghai (CN)

( * ) Notice: Subject to any disclaimer, the term of this patent is extended or adjusted under 35 U.S.C. 154(b) by 524 days.

(21) Appl. No.: 16/383,906

(22) Filed: Apr. 15, 2019

(65) Prior Publication Data

US 2019/0243411 A1     Aug. 8, 2019

Related U.S. Application Data

(62) Division of application No. 15/469,823, filed on Mar. 27, 2017, now Pat. No. 10,310,550.

(30) Foreign Application Priority Data

Jan. 16, 2017    (CN) .................. 201710029624.X (51) Int. Cl.
    *G06F 1/14*         (2006.01)
    *H04Q 9/04*         (2006.01)
    (Continued)

(52) U.S. Cl.
    CPC .............. *G06F 1/14* (2013.01); *G01D 9/285* (2013.01); *G01V 1/48* (2013.01); *H03K 5/135* (2013.01);
    (Continued)

(58) Field of Classification Search
    CPC .......... G06F 1/14; G01D 9/285; G01V 1/48; G05B 19/0423; G05B 2219/25257; H04Q 9/00;
    (Continued)

(56) References Cited

U.S. PATENT DOCUMENTS

2007/0030810 A1    2/2007    Rayner
2012/0083263 A1    4/2012    Kim et al.
2015/0358933 A1*   12/2015   Yamamoto .............. H04W 4/70
                                                            370/329

OTHER PUBLICATIONS

Tian et al., High-Precision Relative Clock Synchronization Using Time Stamp Counters, 2008 IEEE, 13th IEEE International Conference on Engineering of Complex Computer Systems, pp. 69-78 (Year: 2008).*

* cited by examiner

*Primary Examiner* — Toan M Le
(74) *Attorney, Agent, or Firm* — McClure, Qualey & Rodack, LLP (57) ABSTRACT

A method provides data synchronization between a sensor hub and an application processor, which contains at least the following steps: generating and adding a plurality of absolute time stamps in a sensor-data stream; and generating and adding a plurality of pieces of sensor data and a plurality of relative time stamps in the sensor-data stream between the moments of generating each two adjacent absolute time stamps, wherein each relative time stamp is associated with one piece of sensor data.

7 Claims, 5 Drawing Sheets

(51) Int. Cl.
  *H04J 3/06*  (2006.01)
  *G01D 9/28*  (2006.01)
  *H03K 5/135*  (2006.01)
  *G01V 1/48*  (2006.01)
  *H04Q 9/00*  (2006.01)

(52) U.S. Cl.
  CPC ............ *H04J 3/0661* (2013.01); *H04Q 9/00* (2013.01); *H04Q 9/04* (2013.01); *H04Q 2209/823* (2013.01); *H04Q 2209/845* (2013.01)

(58) Field of Classification Search
  CPC ............... H04Q 9/04; H04Q 2209/823; H04Q 2209/845; H04J 3/0661; H03K 5/135
  See application file for complete search history.

METHODS FOR DATA SYNCHRONIZATION BETWEEN A SENSOR HUB AND AN APPLICATION PROCESSOR AND APPARATUSES USING THE SAME

CROSS REFERENCE TO RELATED APPLICATIONS

This application is a divisional of pending U.S. application Ser. No. 15/469,823, filed on Mar. 27, 2017, now U.S. Pat. No. 10,310,550, which claims the benefit of China Patent Application No. 201710029624.X, filed on Jan. 16, 2017, the entirety of which is incorporated by reference herein.

BACKGROUND

Technical Field

The present invention relates to data synchronization, and in particular, to methods for data synchronization between a sensor hub and an application processor and apparatuses using the same.

Description of the Related Art

A sensor hub obtains raw data from different types of sensors, calibrates the data obtained, and may obtain a gesture of the equipment by employing proper algorithms to the calibrated data. The sensor hub may transmit the raw data or the gesture with the other motion information to an application processor. Since the data, gesture, or information sent by the sensor hub varies over time, the application processor has to make sure their time is stamped when the data, gesture, or information is used. Therefore, what is needed are methods for data synchronization between a sensor hub and an application processor and apparatuses using the same to increase the data transfer rate between the sensor hub and the application processor.

BRIEF SUMMARY

An embodiment of the invention introduces a method for data synchronization between a sensor hub and an application processor, which contains at least the following steps: generating and adding a plurality of absolute time stamps in a sensor-data stream; and generating and adding a plurality of pieces of sensor data and a plurality of relative time stamps in the sensor-data stream between the moments of generating each two adjacent absolute time stamps, where each relative time stamp is associated with one piece of sensor data.

An embodiment of the invention introduces a method for data synchronization between a sensor hub and an application processor, which contains at least the following steps: reading an ID (identifier) from a sensor-data stream; determining whether the ID is a time ID; when the ID is the time ID, reading an absolute time stamp from the sensor-data stream and storing the absolute time stamp in the application processor; and when the ID is not the time ID, reading sensor data and a relative time stamp from the sensor-data stream, generating a recovered time stamp according to the absolute time stamp and the relative time stamp, and converting the recovered time stamp to a value of an RTC (Real-time Counter) of the application processor.

An embodiment of the invention introduces an apparatus for data synchronization between a sensor hub and an application processor, at least containing: a memory storing a sensor-data stream; and a sensor hub coupled to a micro-sensor and the memory. The sensor hub generates and adds a plurality of absolute time stamps in the sensor-data stream; and generates and adds a plurality of pieces of sensor data and a plurality of relative time stamps in the sensor-data stream between the moments of generating each two adjacent absolute time stamps, where each relative time stamp is associated with one piece of sensor data.

A detailed description is given in the following embodiments with reference to the accompanying drawings.

BRIEF DESCRIPTION OF THE DRAWINGS

The present invention can be fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
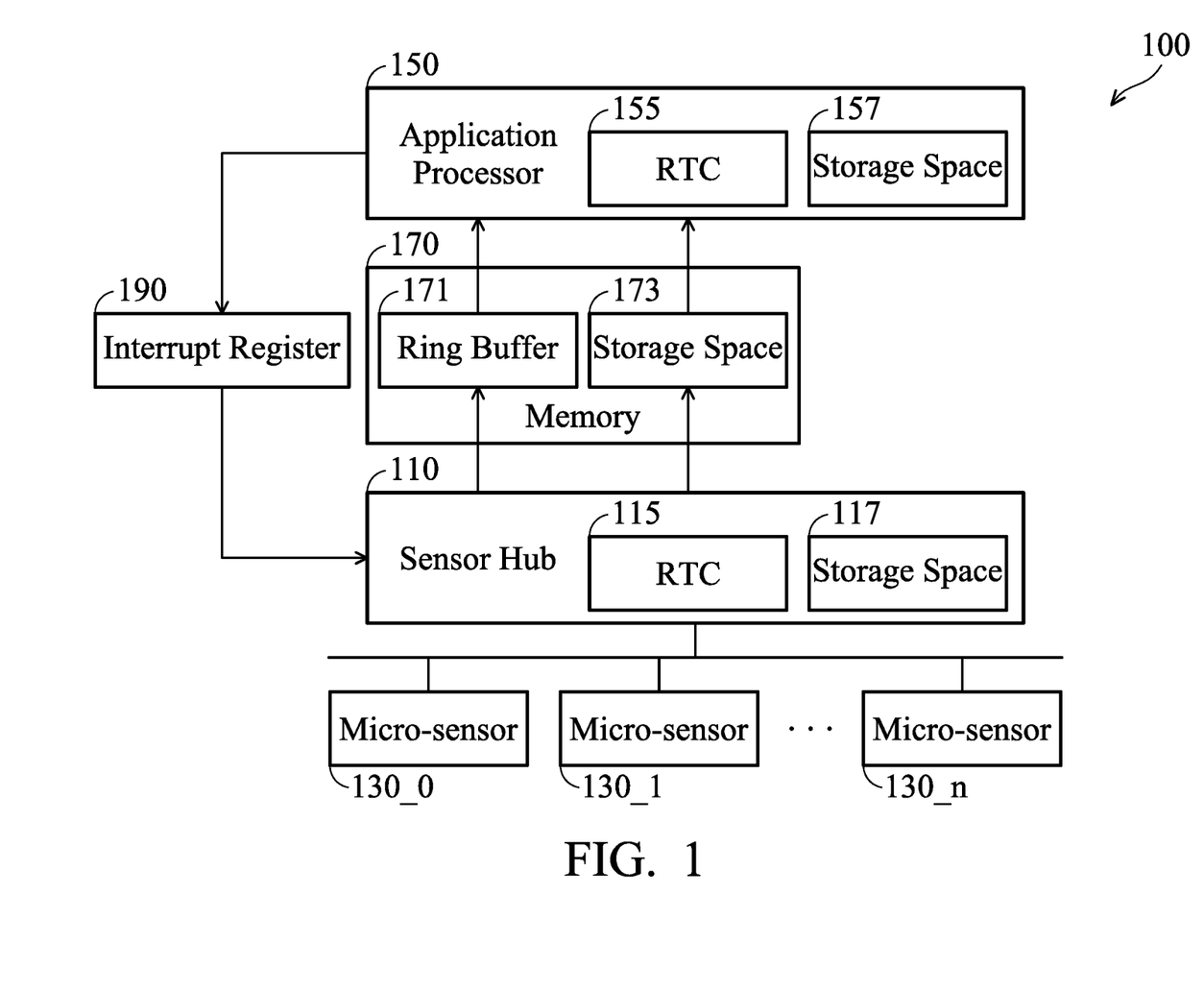
FIG. 1 is a block diagram of an electronic apparatus according to an embodiment of the invention.

FIG. 1 is a block diagram of an electronic apparatus according to an embodiment of the invention. An electronic apparatus 100 contains micro-sensors 130_0 to 130_$n$ coupled to a sensor hub 110, where n represents the total number of micro-sensors of the electronic apparatus. Any of the micro-sensors 130_0 to 130_$n$ may be a passive infrared sensor, a sound sensor, an accelerometer, a gyro sensor, or others. The passive infrared sensor may measure IR (infrared) light radiating from objects in its field of view. The sound sensor may detect the sound strength of the environment. The accelerometer may detect magnitude and direction of the proper acceleration and sense orientation, vibration, shock, and falling in a resistive medium. The gyro sensors may sense angular velocity from a force applied to a vibrating element. The sensor hub 110 may be realized in an MCU (Micro Control Unit), a coprocessor or a DSP (Digital Signal Processor). The micro-sensors 130_0 to 130_n may connect to the sensor hub 110 via I²C (inter-integrated circuit) bus. The sensor hub may collect raw data from the micro-sensors 130_0 to 130_n, calibrate the raw data and translate the calibrated data into messages, such as gestures, movement directions, movement lengths, etc. by employing proper algorithms. The sensor hub 110 may carry the raw data and/or the translated messages in a structured format and generate a sensor-data stream. A memory 170 may allocate memory space for a ring buffer 171 utilized by the sensor hub 110 to write the sensor-data stream. Next, the application processor 150 may receive the sensor-data stream from the ring buffer 171. The application processor 150 may load and execute program codes of one or more applications to interpret the raw data and/or the translated messages of the sensor-data stream so as to generate control signals, and perform designated functions according to the control signals.

Figure 2:
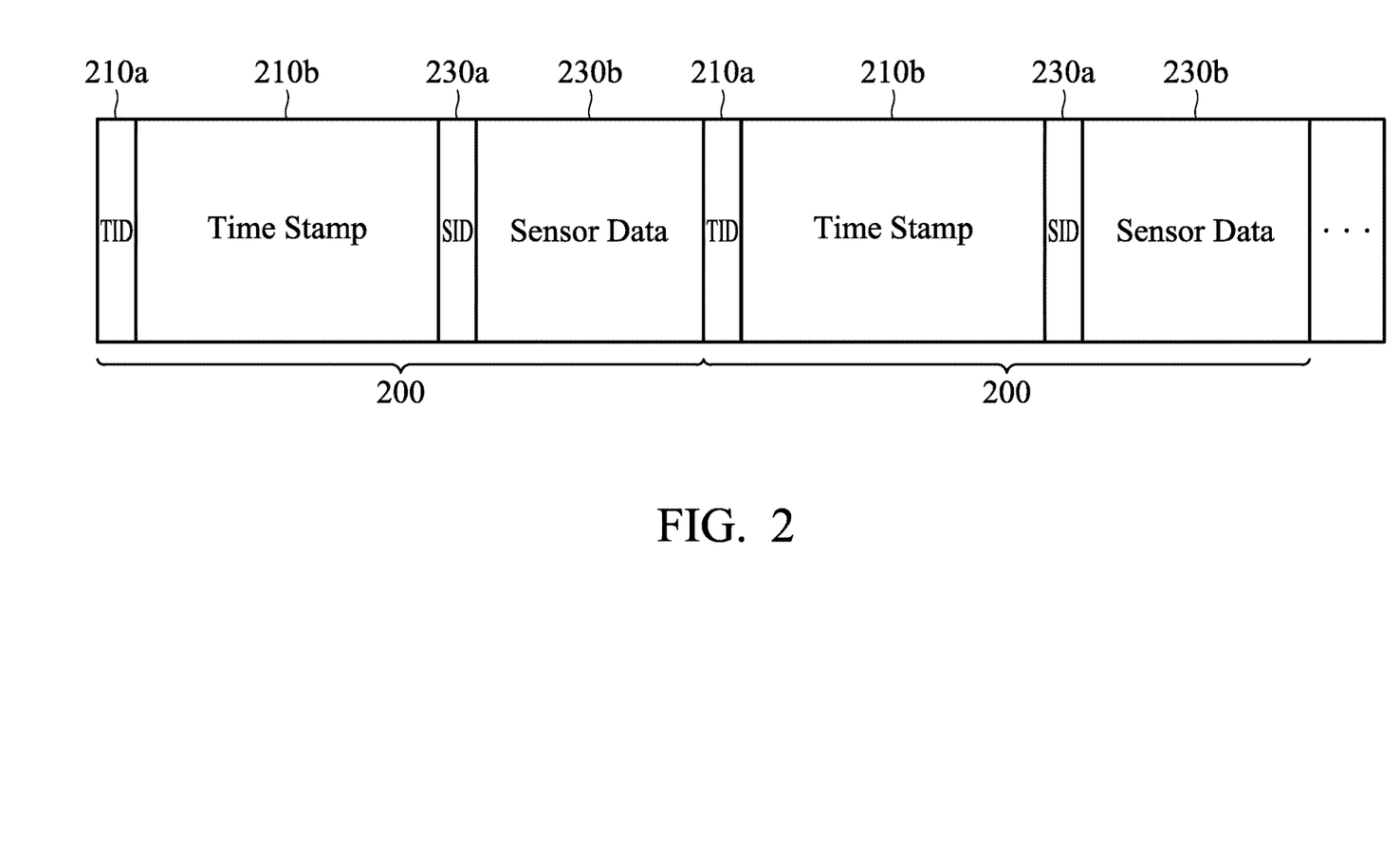
FIG. 2 is a schematic diagram of a format of a sensor-data stream according to an embodiment of the invention.
Figure 3:
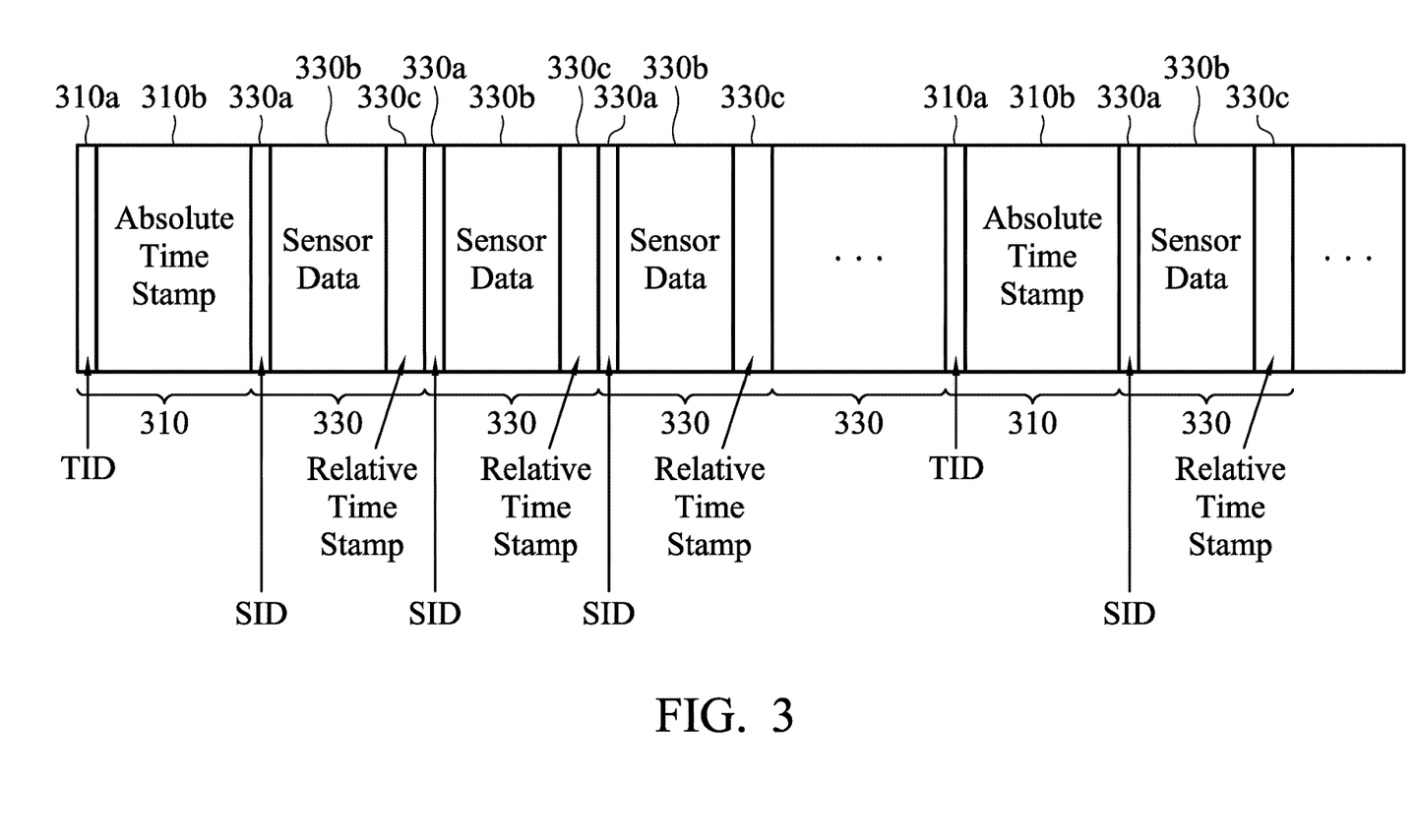
FIG. 3 is a schematic diagram of an improved format of a sensor-data stream according to an embodiment of the invention.

The sensor hub 110 contains an RTC (Real-Time Counter) 115 that may use i bits, such as 64, 32 bits, etc., to count time. In some implementations, a time stamp is attached before every sensor-data for indicating at which moment the sensor-data corresponding to one of the micro-sensors 130_0 to 130_n is generated. FIG. 2 is a schematic diagram of a format of a sensor-data stream according to an embodiment of the invention. The sensor-data stream contains multiple data units 200 and each data unit contains four parts: a time ID (identity) 210a, a time stamp 210b, a sensor ID 230a and sensor data 230b. The time ID 210a is a predefined value, such as "2'b11111111", to make the application processor 150 interpret the following i bits as the times stamp 210b generated by the RTC 115. The sensor ID 230a is used to make the application processor 150 during the interpretation know with which of the micro-sensors 130_0 to 130_n the sensor data 230b of the following j bits is associated. However, the above format of the sensor-data stream can be improved to carry more sensor-data in the ring buffer 171 or consume less memory space for storing sensor-data. In some embodiments, the lengths of the time stamps of the sensor-data stream may be reduced. FIG. 3 is a schematic diagram of an improved format of a sensor-data stream according to an embodiment of the invention. In a sensor-data stream, a time unit 310 is followed by several data units 330. Each time unit 310 contains two parts: a time ID 310a and an absolute time stamp 310b. The time ID 310a is a predefined value to make the application processor 150 to interpret the following i bits as the absolute times stamp 310b generated by the RTC 115. Each data unit 330 contains three parts: a sensor ID 330a, sensor data 330b and a relative time stamp 330c. It is to be understood that the sensor data 330b and the relative time stamp 330c can be swapped and the invention should not be limited thereto. Each piece of sensor data 330b may be raw data generated by one of the micro-sensors 130_0 to 130_n or a translated message generated by the sensor hub 110. The sensor ID 330a is used to make the application processor 150 during the interpretation know with which of the micro-sensors 130_0 to 130_n the sensor data 330b of the following j bits is associated. The relative time stamp 330c may use k bits to represent an offset relative to the last absolute time stamp 310b, where k is less than i. In the sensor-data stream, the sensor hub 110 periodically transmits the absolute time stamp 310b and each time period is associated with bits used in the relative time stamp 330c. Assume that m ms (milliseconds) have elapsed in each clock cycle: The quantity of the data units 330 generated in each time period is the quantity of the sensor data 330b generated in $\pm(2^{(k-1)})\times m$ or $+(2^k)\times m$ ms based on the absolute time stamp 310b. TR_last$\pm(2^{(k-1)})$ or TR_last+$2^k$ may be referred to as a timer threshold and TR_last represents the last absolute time stamp 310b. For example, when 1 ms has elapsed in each clock cycle and the relative time stamp 330c is represented in 16 bits, the quantity of data units 330 generated in each time period is the quantity of sensor data 330b generated in $\pm(2^{15})=\pm32568$ ms centered by the absolute time stamp 310b. In other words, the relative time stamps between two absolute time stamps 310b range from $-2 k-1$ to $2 k-1$ or 0 to 2 k. Comparing to FIG. 2, i–k bits are saved for storing each piece of sensor data 330b.

The ring buffer 171 contains two pointers, a read pointer and a write pointer. The read pointer points to the start address of the first time unit 310 or the first data unit 330 of the ring buffer 171 that has not been read by the application processor 150. The write pointer points to the beginning address of available space of the ring buffer 171.

Figure 4:
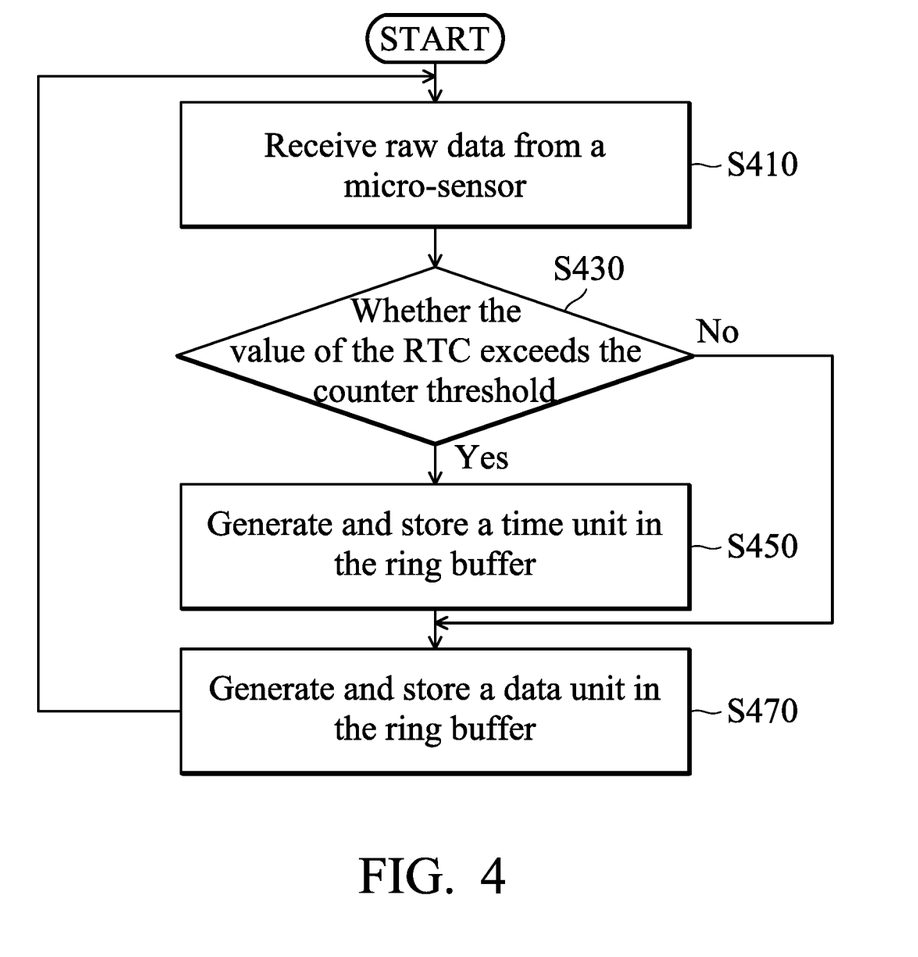
FIG. 4 is a flowchart of a method for writing a sensor-data stream according to an embodiment of the invention.

Embodiments of the invention introduce methods for writing a sensor-data stream that generate and add absolute time stamps 310b in the sensor-data stream periodically, and generate and add multiple pieces of sensor data 330b and relative time stamps 330c in the sensor-data stream between the moments of generating any two adjacent absolute time stamps 310b, where each of the relative time stamps is associated with one piece of sensor data 330b. FIG. 4 is a flowchart of a method for writing a sensor-data stream according to an embodiment of the invention. The method is performed by the sensor hub 110 to repeatedly execute a loop. Each time raw data is received from one of the micro-sensors 130_0 to 130_n (step S410), it is determined whether the value of the RTC 115 exceeds a counter threshold (step S430). When the value of the RTC 115 exceeds the counter threshold (the "Yes" path of step S430), a time unit 310 and a data unit 330 are generated and stored in the ring buffer 171 in a row (steps S450 and S470). Specifically, in step S450, the sensor hub 110 treats the current value of the RTC 115 (which may be referred to as a first counter value) as an absolute time stamp 310b, writes the time ID 310a and the absolute time stamp 310b from an address of the ring buffer 171 pointed to by the write pointer and moves the write pointer to the next address subsequent to the absolute time stamp 310b (that is, the time unit 310) of the ring buffer 171. The sensor hub 110 may contain storage space 117 for storing the up-to-date absolute time stamp (that is, the absolute time stamp 310b of step S450). The storage space 117 may be realized by a register, a cache or a flash memory, or others. Next, in step S470, the sensor hub 110 generates sensor data 330b according to the raw data and generates a relative time stamp 330c by subtracting the value of the RTC 115 (also referred to as a second counter value) from the stored up-to-date absolute time stamp. The sensor hub 110 writes the sensor ID 330a corresponding to the received raw data, the sensor data 330b and the relative time stamp 330c from the address of the ring buffer 171 pointed to by the write pointer and moves the write pointer to the next address subsequent to the relative time stamp 330c (that is, the data unit 330) of the ring buffer 171. When the value of the RTC 115 does not exceed the counter threshold (the "No" path of step S410), the sensor hub 110 generates and stores the data unit 330 in the ring buffer 171 (step S470). Specifically, in step S470, the sensor hub 110 generates a relative time stamp 330c by subtracting a value of the RTC 115 (also referred to as a third counter value) from the up-to-date absolute time stamp stored in the storage space 117 and generates sensor data 330b according to the raw data. The sensor hub 110 writes the sensor ID 330a corresponding to the received raw data, the sensor data 330b and the relative time stamp 330c from the address of the ring buffer 171 pointed to by the write pointer and moves the write pointer to the next address subsequent to the relative time stamp 330c (that is, the data unit 330) of the ring buffer 171. In addition, in step S470, when the address pointed to by the moved write pointer exceeds the end address of the ring buffer, the sensor hub 110 moves the write pointer to point to the start address of the ring buffer 171.

Figure 5:
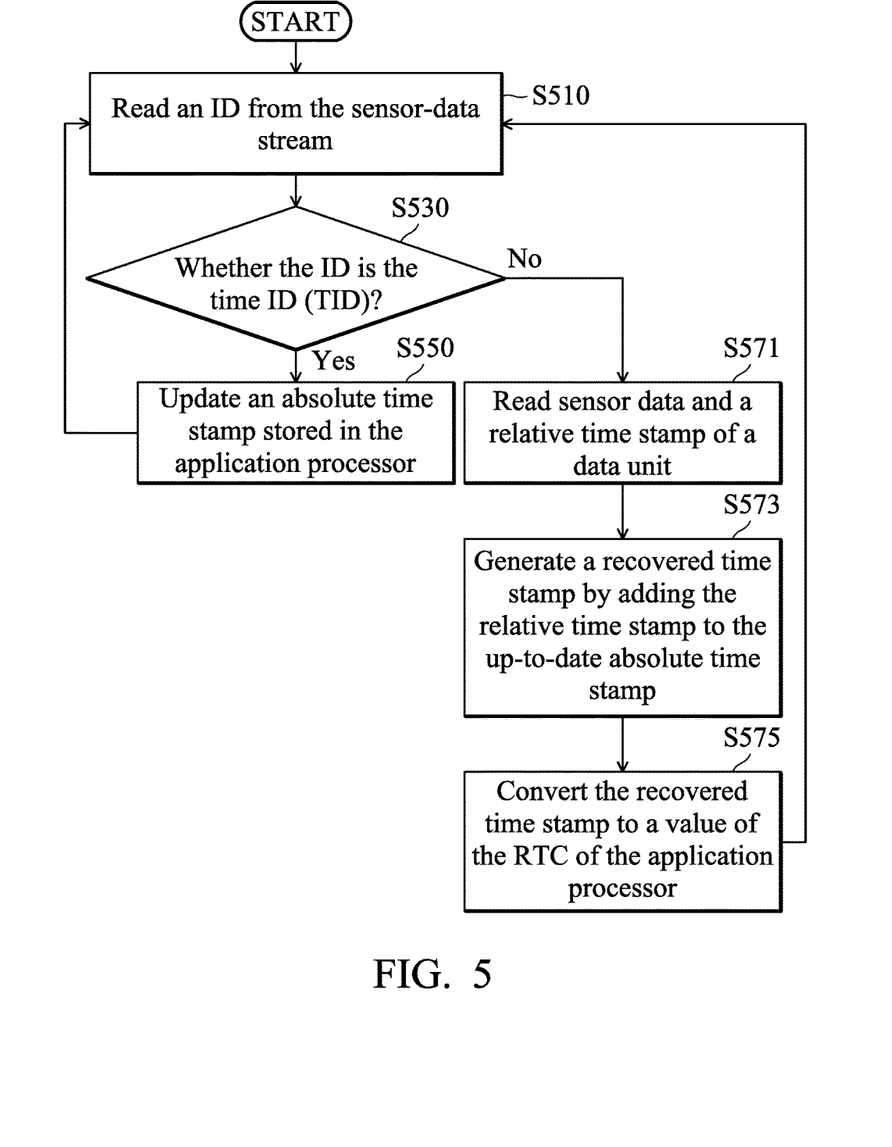
FIG. 5 is a flowchart of a method for reading a sensor-data stream according to an embodiment of the invention.

FIG. 5 is a flowchart of a method for reading a sensor-data stream according to an embodiment of the invention. The method is performed by the application processor 150 to execute a loop repeatedly. The application processor 150 begins with a reading of an ID from the sensor-data stream (step S510) and determines whether the ID is a time ID (step S530). Specifically, in step S510, the application processor 150 may read 8 bits from an address pointed to by the read pointer and move the read pointer to the next address of the ring buffer 171 subsequent to the read ID. In step S530, the application processor 150 may determine whether the value of 8 bits represents a time ID, such as "2'b11111111". The 8 bits are described for the purpose of illustration and the invention should not be limited thereto. Those skilled in the art may devise the length of ID depend on different design requirements. For example, when the sensor hub 110 connects 7 micro-sensors, it requires only 3 bits to identify different micro-sensors and the absolute time stamp. When the sensor hub 110 connects over 256 micro-sensors, it requires more than 8 bits to identify different micro-sensors and the absolute time stamp. When the ID is the time ID (the "Yes" path of step S530), an absolute time stamp 310b (that is, the up-to-date absolute time stamp) following the time ID is read from the sensor-data stream and an absolute time stamp (that is, the prior absolute time stamp) stored in the application processor 150 is updated with the read one (step S550). Specifically, in step S550, the application processor 150 may read i bits from an address pointed to by the read pointer as the absolute time stamp, update the absolute time stamp stored in the storage space 157 with the read one and move the read pointer to point to the next address of the ring buffer 171 subsequent to the read absolute time stamp. The storage space 157 may be realized by a register, a cache or a flash memory, or others. When the ID is not the time ID (in other words, the ID is a sensor ID) (the "No" path of step S530), sensor data 330b and a relative time stamp 330c of a data unit 330 are read (step S571), a recovered time stamp is generated by adding the relative time stamp to the up-to-date absolute time stamp to indicate at which moment the sensor data 330b is generated (step S573). Specifically, in step S571, the application processor 150 may read (j+k) bits from an address pointed to by the read pointer, parse the read bits as the sensor data 330b and the relative time stamp 330c and move the read pointer to the next address of the ring buffer 171 subsequent to the read data unit. In step S573, a recovered time stamp may be generated by using the Equation as follows:

$$TS_{rc}=TS_a+TS_b \quad (1)$$

where $TS_{rc}$ represents a recovered time stamp, $TS_a$ represents an absolute time stamp and $TS_b$ represents a relative time stamp. Next, since an application is operated based on the system time generated by the RTC 155 of the application processor 150, the application processor 150 converts the recovered time stamp to a value of the RTC 155 of the application processor 150 (step S575). In step S575, the converted value may be generated by using the Equation as follows:

$$TS_{cnv}=f(TS_{rc}) \quad (2)$$

where $TS_{cnv}$ represents a converted value, $TS_{rc}$ represents a recovered time stamp and f( ) represents a conversion function. The design of the conversion function may vary with different types of the RTC 155 of the application processor 150 and the RTC 115 of the sensor hub 110. It should be understood that the sensor ID 330a read in step S510, the sensor data 330b read in step S571 and the value converted in step S575 may be sent to a relevant application, thereby enabling the application to generate control signals accordingly and complete designated functions according to the control signals.

In some embodiments, the RTC 155 of the application processor 150 may use more bits to count time than the RTC 115 of the sensor hub 110. For example, the RTC 155 uses 64 bits to count time while the RTC 115 uses 32 bits to count time. Since the precision of the RTC 155 is higher than that of the RTC 115, a certain degree of bias between them is accumulated after a period of time has elapsed. The memory 170 may allocate memory space 173 for writing the current value of the RTC 115 by the sensor hub 110. The application processor 150 may periodically set an interrupt register 190 to issue an interrupt to the sensor hub 110. After receiving the interrupt, the sensor hub 110 writes the current value of the RTC 115 in the memory space 173 immediately, thereby enabling the application processor 150 to read the current value of the RTC 115 from the memory space 173. After reading the value of the RTC 115 from the memory space 173 at this interrupt moment t, the application processor 150 may calculate the bias by using the Equation as follows:

$$\sigma=TS_p-(f(TS_t)-f(TS_{t-1})) \quad (3)$$

where $\sigma$ represents a bias, $TS_p$ represents a counter value of an interrupt period between two interrupt moments, $TS_t$ represents a value read from the memory space 173 at an interrupt moment t, $TS_{t-1}$ represents a value read from the memory space 173 at the prior interrupt moment t−1 and f( ) represents a conversion function. Furthermore, in order to take the bias into account in the conversion, in step S575, the converted value may be generated by using the Equation as follows instead:

$$TS_{cnv}=f(TS_{rc})+\sigma \quad (4)$$

where $TS_{cnv}$ represents a converted value, $TS_{rc}$ represents a recovered time stamp, f( ) represents a conversion function and $\sigma$ represents a bias.

Although the embodiment has been described as having specific elements in FIG. 1, it should be noted that additional elements may be included to achieve better performance without departing from the spirit of the invention. While the process flows described in FIGS. 4 and 5 include a number of operations that appear to occur in a specific order, it should be apparent that those skilled in the art can modify the order to achieve the same objectives. Thus, the invention should not be limited to the specific order.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for data synchronization between a sensor hub and an application processor, comprising:
   reading an ID (identifier) from a sensor-data stream;
   determining whether the ID is a time ID;
   when the ID is the time ID, reading an absolute time stamp from the sensor-data stream and storing the absolute time stamp in the application processor;
   when the ID is not the time ID, reading sensor data and a relative time stamp from the sensor-data stream, generating a recovered time stamp according to the absolute time stamp and the relative time stamp and converting the recovered time stamp to a value of an RTC (Real-time Counter) of the application processor;
   after issuing an interrupt to the sensor hub, reading a first up-to-date value of an RTC of the sensor hub; and
   calculating a bias according to the first up-to-date value and a second up-to-date value corresponding to a prior interrupt;
   wherein the bias is calculated by using an Equation as follows:

$$\sigma = TS_p - (f(TS_t) - f(TS_{t-1})),$$

wherein σ represents the bias, $TS_p$ represents a counter value of an interrupt period, $TS_t$ represents the first up-to-date value, $TS_{t-1}$ represents the second up-to-date value and f( ) represents a conversion function.

2. The method of claim 1, wherein the sensor data and the converted value are sent to an application, thereby enabling the application to generate a control signal accordingly and complete a designated function according to the control signal.

3. The method of claim 1, wherein the recovered time stamp is generated by using an Equation as follows:

$$TS_{rc} = TS_a + TS_b,$$

wherein $TS_{rc}$ represents the recovered time stamp, $TS_a$ represents the absolute time stamp and $TS_b$ represents the relative time stamp, and the converted value is generated by using an Equation as follows:

$$TS_{cnv} = f(TS_{rc}),$$

wherein $TS_{cnv}$ represents the converted value, $TS_{rc}$ represents the recovered time stamp and f( ) represents a conversion function.

4. The method of claim 1, wherein the recovered time stamp is generated by using an Equation as follows:

$$TS_{rc} = TS_a + TS_b,$$

wherein $TS_{rc}$ represents the recovered time stamp, $TS_a$ represents the absolute time stamp and $TS_b$ represents the relative time stamp, and the converted value is generated by using an Equation as follows:

$$TS_{cnv} = f(TS_{rc}) + \sigma,$$

wherein $TS_{cnv}$ represents the converted value, $TS_{rc}$ represents the recovered time stamp, f( ) represents a conversion function and σ represents the bias.

5. An apparatus for data synchronization between a sensor hub and an application processor, comprising:
   a memory storing a sensor-data stream;
   a sensor hub, coupled to a micro-sensor and the memory, generating and adding a plurality of first absolute time stamps in the sensor-data stream; and generating and adding a plurality of pieces of first sensor data and a plurality of first relative time stamps in the sensor-data stream between the moments of generating each two adjacent first absolute time stamps, wherein each first relative time stamp is associated with one piece of first sensor data; and
   an application processor, coupled to the memory, reading an ID (identifier) from the sensor-data stream; determining whether the ID is a time ID; when the ID is the time ID, reading a second absolute time stamp from the sensor-data stream and storing the second absolute time stamp in the application processor; and when the ID is not the time ID, reading one piece of second sensor data and a second relative time stamp from the sensor-data stream, generating a recovered time stamp according to the second absolute time stamp and the second relative time stamp and converting the recovered time stamp to a value of an RTC of the application processor;
   wherein, after issuing an interrupt to the sensor hub, the application processor reads a first up-to-date value of an RTC of the sensor hub; and calculates a bias according to the first up-to-date value and a second up-to-date value corresponding to a prior interrupt;
   wherein the bias is calculated by using an Equation as follows:

$$\sigma = TS_p - (f(TS_t) - f(TS_{t-1})),$$

wherein σ represents the bias, $TS_p$ represents a counter value of an interrupt period, $TS_t$ represents the first up-to-date value, $TS_{t-1}$ represents the second up-to-date value and f( ) represents a conversion function.

6. The apparatus of claim 5, wherein the piece of second sensor data and the converted value are sent to an application executed by the application processor, thereby enabling the application to generate a control signal accordingly and complete a designated function according to the control signal.

7. The apparatus of claim 5, wherein the recovered time stamp is generated by using an Equation as follows:

$$TS_{rc} = TS_a + TS_b,$$

wherein $TS_{rc}$ represents the recovered time stamp, $TS_a$ represents the second absolute time stamp and $TS_b$ represents the second relative time stamp, and the converted value is generated by using an Equation as follows:

$$TS_{cnv} = f(TS_{rc}) + \sigma,$$

wherein $TS_{cnv}$ represents the converted value, $TS_{rc}$ represents the recovered time stamp, f( ) represents a conversion function and σ represents the bias.

* * * * *